(12) United States Patent
Hu et al.

(10) Patent No.: US 12,727,364 B2
(45) Date of Patent: Sep. 1, 2026

(54) ORGANIC LIGHT-EMITTING DIODE DISPLAY PANEL HAVING AUXILIARY ELECTRODE CONTACT STRUCTURE AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Jingyuan Hu, Shenzhen (CN); Gaobo Lin, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 1282 days.

(21) Appl. No.: 17/623,491

(22) PCT Filed: Dec. 23, 2021

(86) PCT No.: PCT/CN2021/140729
§ 371 (c)(1),
(2) Date: Jun. 22, 2023

(87) PCT Pub. No.: WO2023/108780
PCT Pub. Date: Jun. 22, 2023

(65) Prior Publication Data

US 2024/0049565 A1 Feb. 8, 2024

(30) Foreign Application Priority Data

Dec. 17, 2021 (CN) ........................ 202111552745.5

(51) Int. Cl.
*H10K 59/12* (2023.01)
*H10K 59/124* (2023.01)
*H10K 59/80* (2023.01)

(52) U.S. Cl.
CPC ... *H10K 59/80522* (2023.02); *H10K 59/1201* (2023.02); *H10K 59/124* (2023.02)

(58) Field of Classification Search
CPC ......... H10K 59/80522; H10K 59/1201; H10K 59/124

(Continued)

(56) References Cited

U.S. PATENT DOCUMENTS

2012/0127411 A1 5/2012 Lin et al.
2021/0020721 A1 1/2021 Kwack et al.

FOREIGN PATENT DOCUMENTS

CN 102053439 A 5/2011
CN 108155299 A * 6/2018 ....... H10K 59/80522

(Continued)

OTHER PUBLICATIONS

International Search Report in International application No. PCT/CN2021/140729, mailed on Aug. 31, 2022.

(Continued)

*Primary Examiner* — Phuc T Dang
(74) *Attorney, Agent, or Firm* — PV IP PC; Peter Stecher; Wei Te Chung

(57) ABSTRACT

An organic light-emitting diode (OLED) display panel and a manufacturing method thereof are provided. The OLED display panel includes a substrate, a thin film transistor device, an auxiliary electrode, a passivation layer, a planarization layer, and a light-emitting device layer. The light-emitting device layer includes an anode layer, a light-emitting functional layer, and a cathode layer. Wherein, a first via hole penetrating the planarization layer and the (Continued)

passivation layer is defined above the auxiliary electrode, and a notch between the auxiliary electrode and the planarization layer is defined at a bottom of an inner sidewall of the first via, and the cathode layer extends through the first via hole to the notch to connect with the auxiliary electrode.

14 Claims, 3 Drawing Sheets

(58) Field of Classification Search
USPC ........................................................... 257/40
See application file for complete search history.

(56) References Cited

FOREIGN PATENT DOCUMENTS

| | | | | | |
|---|---|---|---|---|---|
| CN | 112234080 | A | | 1/2021 | |
| CN | 112289945 | A | | 1/2021 | |
| CN | 113097412 | A | * | 7/2021 | ........... H10K 50/824 |
| CN | 119947438 | A | * | 5/2025 | ......... H10K 59/8792 |

OTHER PUBLICATIONS

Written Opinion of the International Search Authority in International application No. PCT/CN2021/140729,mailed on Aug. 31, 2022.

Japanese Office Action issued in corresponding Japanese Patent Application No. 特願 2022-502018 dated Jan. 30, 2024, pp. 1-5.

* cited by examiner

ORGANIC LIGHT-EMITTING DIODE DISPLAY PANEL HAVING AUXILIARY ELECTRODE CONTACT STRUCTURE AND MANUFACTURING METHOD THEREOF

FIELD OF INVENTION

The present invention relates to a field of display technology, particularly relates to an organic light-emitting diode (OLED) display panel and a manufacturing method thereof.

BACKGROUND OF INVENTION

A structure of an organic light-emitting diode (OLED) display panel includes a transparent anode layer, a light-emitting layer, and a metal cathode layer. In order to improve transmittance of a top-emitting device, a metal cathode layer is usually made thinner, which causes circuit resistance of the metal cathode layer to be larger, thereby causing a serious IR-drop problem. This further leads to obvious uneven brightness of the OLED display panel, which seriously affects display effect of the OLED display panel. In order to resolve the problem of uneven display brightness of the OLED display panel, an auxiliary electrode is usually configured to be connected to a thin metal cathode layer. The IR-drop problem can be resolved by this configuration of auxiliary electrodes so that the brightness uniformity of the OLED display panel can be solved to a certain extent. This way of configuring the auxiliary electrode to be connected to the thin metal cathode layer usually needs to provide a spacer column between the cathode layer and the auxiliary electrode. However, due to a high-volume ratio of the spacer column, a thickness, aperture ratio, and a package process of the OLED display panel are affected. In addition, the material of the spacer column is less selective, and additional manufacturing procedures are usually required, which causes the manufacturing process of the OLED display panel to become more complicated and reduces the production efficiency.

Technical Problem

In order to resolve the IR-drop problem, a current organic light-emitting diode (OLED) display panel must be provided with auxiliary electrodes and spacer columns for the auxiliary electrodes. However, due to the high-volume ratio of the spacer column, the thickness, the aperture ratio, and the package of the OLED display panel are affected. This technical problem needs to be further resolved.

SUMMARY OF INVENTION

In order to solve the aforesaid technical problems, the present invention provides an organic light-emitting diode (OLED) display panel and a manufacturing method thereof. In the present invention, a notch is defined between the planarization layer and the passivation layer above the auxiliary electrode. That is, the planarization layer is directly used as a support structure of the notch so that the cathode layer can connect with the auxiliary electrode in the notch, thereby improving the IR Drop problem of the OLED display panel. It is experimentally verified that the planarization layer will not collapse. In addition, the present invention adopts a three-layer molybdenum-titanium/copper/molybdenum-titanium alloy structure for the auxiliary electrode and the signal input pad on the same layer as the auxiliary electrode so that the signal input pad can be directly connected to the control unit without the need of providing a solder pad on the signal input pad for protecting the signal input pad. This can save a photomask in the manufacturing process.

The present invention provides an OLED display panel. The OLED display panel includes: a substrate; a thin film transistor device disposed on the substrate, wherein the thin film transistor device includes an active layer, a gate layer, a source, and a drain; an auxiliary electrode arranged in a same layer as the source and the drain; a passivation layer disposed on the source, the drain, and the auxiliary electrode; a planarization layer disposed on the passivation layer; and a light-emitting device layer disposed on the planarization layer, wherein the light-emitting device layer includes an anode layer, a light-emitting functional layer, and a cathode layer; wherein a first via hole penetrating the planarization layer and the passivation layer is defined above the auxiliary electrode, and a notch between the auxiliary electrode and the planarization layer is defined at a bottom of an inner sidewall of the first via; and wherein the cathode layer extends through the first via hole to the notch to connect with the auxiliary electrode.

In the OLED display panel according to an embodiment of the present invention, further including: a buffer layer disposed between the substrate and the thin film transistor device; an interlayer dielectric layer disposed on the buffer layer; and a signal input pad disposed on the interlayer dielectric layer; wherein an opening is defined on the passivation layer above the signal input pad to expose the signal input pad.

In the OLED display panel according to an embodiment of the present invention, further including a gate insulating layer disposed between the gate layer and the active layer and a light-shielding metal layer disposed on the substrate corresponding to the active layer.

In the OLED display panel according to an embodiment of the present invention, wherein the anode layer is connected to the source through a second via hole penetrating the planarization layer and the passivation layer, the source is connected to the active layer through a third via hole penetrating the interlayer dielectric layer, and the source is further connected to the light-shielding metal layer through a fourth via hole penetrating the interlayer dielectric layer and the buffer layer.

In the OLED display panel according to an embodiment of the present invention, further including a first electrode arranged adjacent to the light-shielding metal layer and electrically connected to the light-shielding metal layer and a second electrode arranged adjacent to the active layer and corresponding to the first electrode, wherein the second electrode and the first electrode form a storage capacitor.

In the OLED display panel according to an embodiment of the present invention, wherein the first electrode and the second electrode include indium gallium zinc oxide.

In the OLED display panel according to an embodiment of the present invention, wherein the thickness of the planarization layer ranges from 1 micrometer to 4 micrometers.

In the OLED display panel according to an embodiment of the present invention, wherein the auxiliary electrode and the signal input pad include molybdenum titanium/copper/molybdenum titanium alloy.

The present invention further provides another OLED display panel. The OLED display panel includes: a substrate; a thin film transistor device disposed on the substrate, wherein the thin film transistor device includes an active layer, a gate layer, a source, and a drain; an auxiliary electrode arranged in the same layer as the source and the drain; a passivation layer disposed on the source, the drain, and the auxiliary electrode; a planarization layer disposed on the passivation layer, wherein a thickness of the planarization layer ranges from 1 micrometer to 4 micrometers; and a light-emitting device layer disposed on the planarization layer, wherein the light-emitting device layer includes an anode layer, a light-emitting functional layer, and a cathode layer; wherein a first via hole penetrating the planarization layer and the passivation layer is defined above the auxiliary electrode, a notch between the auxiliary electrode and the planarization layer is defined at a bottom of an inner sidewall of the first via; wherein the cathode layer extends through the first via hole to the notch to connect with the auxiliary electrode; and wherein the light-emitting functional layer covers a partial area of the auxiliary electrode corresponding to the first via hole, and the cathode layer covers another partial area of the auxiliary electrode in the notch.

In the OLED display panel according to an embodiment of the present invention, further including a buffer layer disposed between the substrate and the thin film transistor device and an interlayer dielectric layer disposed on the buffer layer.

In the OLED display panel according to an embodiment of the present invention, further including a signal input pad disposed on the interlayer dielectric layer, wherein an opening is defined on the passivation layer above the signal input pad to expose the signal input pad.

In the OLED display panel according to an embodiment of the present invention, further including a gate insulating layer disposed between the gate layer and the active layer and a light-shielding metal layer disposed on the substrate corresponding to the active layer.

In the OLED display panel according to an embodiment of the present invention, wherein the anode layer is connected to the source through a second via hole penetrating the planarization layer and the passivation layer, the source is connected to the active layer through a third via hole penetrating the interlayer dielectric layer, and the source is further connected to the light-shielding metal layer through a fourth via hole penetrating the interlayer dielectric layer and the buffer layer.

In the OLED display panel according to an embodiment of the present invention, further including a first electrode arranged adjacent to the light-shielding metal layer and electrically connected to the light-shielding metal layer and a second electrode arranged adjacent to the active layer and corresponding to the first electrode, wherein the second electrode and the first electrode form a storage capacitor.

In the OLED display panel according to an embodiment of the present invention, wherein the first electrode and the second electrode include indium gallium zinc oxide.

In the OLED display panel according to an embodiment of the present invention, wherein the auxiliary electrode and the signal input pad include molybdenum titanium/copper/molybdenum titanium alloy.

The present invention further provides a manufacturing method of an OLED display panel, including: providing a substrate; forming a thin film transistor device and an auxiliary electrode on the substrate; sequentially forming a passivation layer and a planarization layer on the thin film transistor device and the auxiliary electrode; defining a first via hole penetrating the planarization layer above the auxiliary electrode, and defining a second via hole penetrating the planarization layer and the passivation layer above a source of the thin film transistor device; forming an anode layer on the planarization layer, and connecting the anode layer to the source through the second via hole; performing a wet etching process on the passivation layer in the first via hole to form a notch between the auxiliary electrode and the planarization layer; forming a pixel definition layer on the planarization layer to define a light-emitting area and a notch forming area; forming a light-emitting functional layer on the substrate and covering a part of an area of the auxiliary electrode corresponding to the first via in the first via; and forming a cathode layer on the light-emitting functional layer and extending the cathode layer to cover another part of the area of the auxiliary electrode in the notch.

In the manufacturing method of the OLED display panel according to an embodiment of the present invention, wherein the step of forming the cathode layer on the light-emitting functional layer and extending the cathode layer to cover another part of the area of the auxiliary electrode in the notch is implemented by changing an evaporation angle of an evaporation source.

Beneficial Effect

In the present invention, a notch is defined between the planarization layer and the passivation layer above the auxiliary electrode. That is, the planarization layer is directly used as a support structure of the notch so that the cathode layer can connect with the auxiliary electrode in the notch, thereby resolving the IR Drop problem of the organic light-emitting diode (OLED) display panel. It is experimentally verified that the planarization layer will not collapse. Furthermore, the present invention adopts a three-layer molybdenum-titanium/copper/molybdenum-titanium alloy structure for the auxiliary electrode and the signal input pad on the same layer as the auxiliary electrode so that the signal input pad can be directly connected to the control unit without the need of providing a solder pad on the signal input pad for protecting the signal input pad. This can save a photomask in the manufacturing process. In addition, in the present invention, a storage capacitor is provided on one side of the thin film transistor device and the source is connected to the active layer through a third via hole penetrating the interlayer dielectric layer, and the source is further connected to the light-shielding metal layer through a fourth via hole penetrating the interlayer dielectric layer and the buffer layer so that the first electrode is electrically connected to the source and drain of the thin film transistor device to improve the efficiency of the storage capacitor. Therefore, the current of the OLED display panel can be further maintained stable.

DETAILED DESCRIPTION OF PREFERRED EMBODIMENTS

Figure 1:
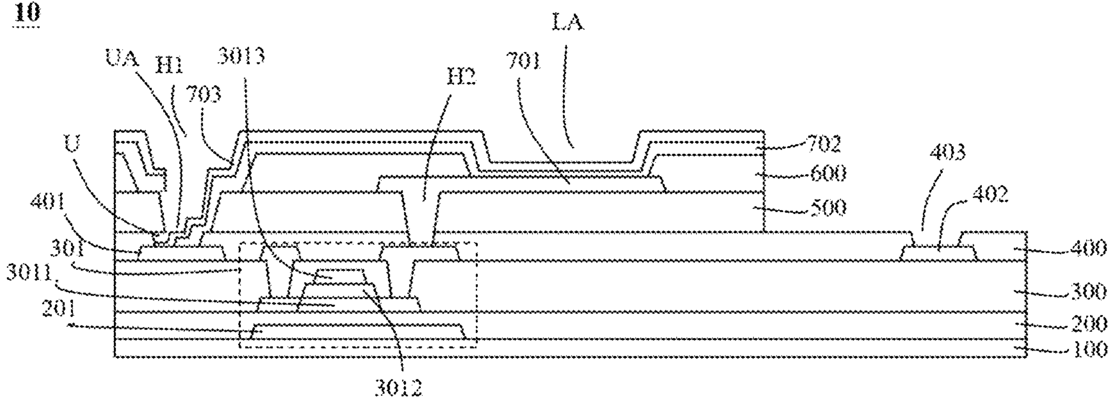
FIG. 1 is a schematic cross-sectional view of an organic light-emitting diode (OLED) display panel according to a first embodiment of the present invention.

The organic light-emitting diode (OLED) display panel and the manufacturing method thereof provided by the embodiments of the present invention will be described in detail with reference to the accompanying drawings. Obviously, the embodiments are only a part of the embodiments of the present invention, rather than all the embodiments. Based on these embodiments of the present invention, all other embodiments obtained by those of ordinary skill in the art without doing creative work shall fall within the protection scope of the present invention.

The description of the following embodiments refers to the attached drawings to illustrate specific embodiments in the present application. The directional terms mentioned in the present invention, such as "above", "below", "front", "back", "left", "right", "inside", "outside", "side", etc., are only directions for referring to the attached drawings. Therefore, the directional terms are used to describe and understand the present invention, rather than limit the present invention. In the drawings, units with similar structures are denoted by the same reference numerals. In the drawings, for clear understanding and ease of description, the thickness of some layers and regions are exaggerated. That is, the size and thickness of each component shown in the drawings are arbitrarily shown, but the present application is not limited thereto.

Please refer to FIG. 1. FIG. 1 is a schematic cross-sectional view of an OLED display panel according to a first embodiment of the present invention. As shown in FIG. 1, the OLED display panel 10 provided by the first embodiment of the present invention includes a substrate 100, a thin film transistor device 301, an auxiliary electrode 401, a passivation layer 400, a planarization layer 500, a pixel definition layer 600, and a light-emitting device layer (701, 702, 703). Wherein, the thin film transistor device 301 is disposed on the substrate 100, and the thin film transistor device 301 includes an active layer 3011, a gate layer 3013, a source 3014, and a drain 3015. Wherein, the auxiliary electrode 401 is provided in the same layer as the source 3014 and the drain 3015. Wherein, the passivation layer 400 is disposed on the source 3014, the drain 3015, and the auxiliary electrode 401. Wherein, the planarization layer 500 is disposed on the passivation layer 400.

Wherein, the planarization layer 500 is disposed on the passivation layer 400, the pixel definition layer 600 is disposed on the planarization layer 500, and the light-emitting device layer (701, 702, 703) is disposed on the planarization layer 500 and the pixel definition layer 600. The light-emitting device layer (701, 702, 703) includes an anode layer 701, a light-emitting functional layer 702, and a cathode layer 703. Wherein, a first via hole H1 penetrating through the planarization layer 500 and the passivation layer 400 is defined above the auxiliary electrode 401, and a notch U between the auxiliary electrode 401 and the planarization layer 500 is defined at the bottom of the inner sidewall of the first via hole H1. Wherein, the cathode layer 703 extends to the notch U through the first via hole H1 to connect to the auxiliary electrode 401. Specifically, the substrate 100 is a transparent substrate made of glass. Specifically, the material of the passivation layer 400 may be silicon nitride or silicon oxide, and the thickness may range from 2000 angstroms to 2500 angstroms. Specifically, the material of the planarization layer 500 may include a polymer adhesive, and the thickness of the planarization layer 500 may range from 1 micrometer to 4 micrometers. Specifically, the material of the active layer 3011 may include indium gallium zinc oxide (IGZO).

Preferably, the OLED display panel 10 further includes a buffer layer 200, an interlayer dielectric layer 300, and a signal input pad 402. Wherein, the interlayer dielectric layer 300 is disposed on the buffer layer 200, and the signal input pad 402 is disposed on the interlayer dielectric layer 300. Wherein, the passivation layer 400 is defined with an opening 403 above the signal input pad 402 to expose the signal input pad 402. Specifically, the signal input pad 402 is used to be bonded with a control unit when the modules are combined. For example, a flexible circuit board (chip on film, COF) is bonded to the signal input pad 402 to provide a signal to the OLED display panel 10 through the COF. That is, the signal input pad 402 functions to connect the COF and the OLED display panel 10 to input signals to the OLED display panel 10.

Wherein, the buffer layer 200 is disposed between the substrate 100 and the thin film transistor device 301. Wherein, the interlayer dielectric layer 300 is disposed on the buffer layer 200. Preferably, the thickness of the planarization layer 500 ranges from 1 μm to 4 μm.

Preferably, the OLED display panel 10 further includes a gate insulating layer 3012 and a light-shielding metal layer 201. The gate insulating layer 3012 is disposed between the gate layer 3013 and the active layer 3011, and the light-shielding metal layer 201 is disposed on the substrate 100 corresponding to the active layer 3011.

Specifically, the buffer layer 200 may be selected from materials with a buffer function, such as rubber, white glue, silica gel, or a thermally conductive adhesive. Specifically, the interlayer dielectric layer 300 can be formed by chemical vapor deposition (CVD) or spin coating to obtain a relatively flat surface. The materials of the interlayer dielectric layer 300 may include organic materials (such as polyimide) or inorganic materials (such as silicon oxide, phosphor silicate glass, or borosilicate glass). Preferably, the material of the signal input pad 402 may include molybdenum titanium/copper/molybdenum titanium alloy. In this embodiment, the signal input pad adopts a three-layer molybdenum-titanium/copper/molybdenum-titanium alloy structure, so that the signal input pad can be directly used as a signal input pad that can be bonded with the control unit without the need of providing a solder pad on the signal input pad, thereby saving a photomask, and reducing production costs.

In this embodiment, a notch U is defined between the planarization layer 500 and the passivation layer 400 above the auxiliary electrode 401. That is, the planarization layer 500 is directly used as the support structure of the notch U so that the cathode layer 703 and the auxiliary electrode 401 can be connected in the notch U, thereby improving the IR Drop problem of the OLED display panel. It has been verified by experiments that the planarization layer 500 will not collapse.

Figure 2:
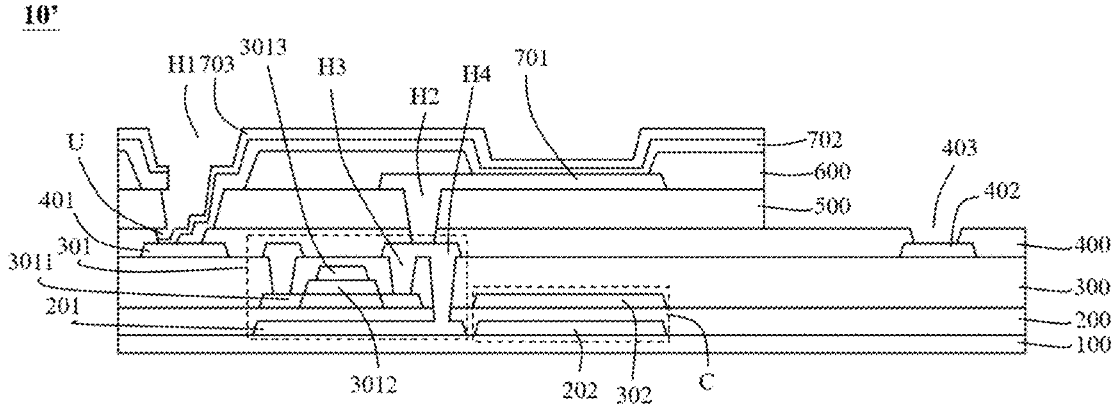
FIG. 2 is a schematic cross-sectional view of an OLED display panel according to a second embodiment of the present invention.

Please refer to FIG. 2. FIG. 2 is a schematic cross-sectional view of an OLED display panel according to a second embodiment of the present invention.

As shown in FIG. 2, the OLED display panel 10' provided by the second embodiment of the present invention includes a substrate 100, a thin film transistor device 301, an auxiliary electrode 401, a passivation layer 400, a planarization layer 500, and a light-emitting device layer (701, 702, 703). Wherein, the thin film transistor device 301 is disposed on the substrate 100, and the thin film transistor device 301 includes an active layer 3011, a gate layer 3013, a source 3014, and a drain 3015. Wherein, the auxiliary electrode 401 is provided in the same layer as the source 3014 and the drain 3015. Wherein, the passivation layer 400 is disposed on the source 3014, the drain 3015, and the auxiliary electrode 401. Wherein, the planarization layer 500 is disposed on the passivation layer 400. Wherein, the light-emitting device layer (701, 702, 703) is disposed on the planarization layer 500. The light-emitting device layer (701, 702, 703) includes an anode layer 701, a light-emitting functional layer 702, and a cathode layer 703. Wherein, a first via hole H1 penetrating through the planarization layer 500 and the passivation layer 400 is defined above the auxiliary electrode 401, and a notch U between the auxiliary electrode 401 and the planarization layer 500 is defined at the bottom of the inner sidewall of the first via hole H1. Wherein, the cathode layer 703 extends to the notch U through the first via hole H1 to connect to the auxiliary electrode 401. Wherein, the light-emitting functional layer 702 covers a partial area of the auxiliary electrode 401 corresponding to the first via hole H1, and the cathode layer 703 covers another partial area of the auxiliary electrode 401 in the notch U.

Specifically, the substrate 100 is a transparent substrate made of glass. Specifically, the material of the passivation layer 400 may be silicon nitride or silicon oxide, and the thickness may range from 2000 angstroms to 2500 angstroms. Specifically, the material of the planarization layer 500 may include a polymer adhesive, and the thickness of the planarization layer 500 may range from 1 micrometer to 4 micrometers. Specifically, the material of the active layer 3011 may include indium gallium zinc oxide (IGZO).

Preferably, the OLED display panel 10' further includes a gate insulating layer 3012 and a light-shielding metal layer 201. The gate insulating layer 3012 is disposed between the gate layer 3013 and the active layer 3011, and the light-shielding metal layer 201 is disposed on the substrate 100 corresponding to the active layer 3011. Preferably, the OLED display panel 10' further includes a buffer layer 200, an interlayer dielectric layer 300, and a signal input pad 402. Wherein, the interlayer dielectric layer 300 is disposed on the buffer layer 200, and the signal input pad 402 is disposed on the interlayer dielectric layer 300. Wherein, the passivation layer 400 is defined with an opening 403 above the signal input pad 402 to expose the signal input pad 402. Specifically, the signal input pad 402 is used to be bonded with a control unit when the modules are combined. For example, a flexible circuit board (chip on film, COF) is bonded to the signal input pad 402 to provide a signal to the OLED display panel 10' through the COF. That is, the signal input pad 402 functions to connect the COF and the OLED display panel 10' to input signals to the OLED display panel 10'. Wherein, the interlayer dielectric layer 300 is disposed on the buffer layer 200. Preferably, the thickness of the planarization layer 500 ranges from 1 μm to 4 μm.

Compared with the OLED display panel 10 of the first embodiment of the present invention, the OLED display panel 10' of the second embodiment of the present invention further includes a first electrode 202 provided adjacent to the light-shielding metal layer 201 and electrically connected to the light-shielding metal layer 201, and a second electrode 302. Wherein the second electrode 302 and the first electrode 202 form a storage capacitor C.

Preferably, the first electrode 202 and the second electrode 302 include indium gallium zinc oxide.

Preferably, the anode layer 701 is connected to the source 3014 through a second via hole H2 penetrating the planarization layer 500 and the passivation layer 400, the source 3014 is connected to the active layer 3011 through a third via hole H3 penetrating the interlayer dielectric layer 300, and the source 3014 is further connected to the light-shielding metal layer 201 through a fourth via hole H4 penetrating the interlayer dielectric layer 300 and the buffer layer 200.

In this embodiment, a notch U is defined between the planarization layer 500 and the passivation layer 400 above the auxiliary electrode 401. That is, the planarization layer 500 is directly used as the support structure of the notch U so that the cathode layer 703 and the auxiliary electrode 401 can be connected in the notch U, thereby improving the IR Drop problem of the OLED display panel. In addition, in this embodiment a storage capacitor C is provided on one side of the thin film transistor device 301 and the source is connected to the active layer through a third via hole penetrating the interlayer dielectric layer, and the source is further connected to the light-shielding metal layer through a fourth via hole penetrating the interlayer dielectric layer and the buffer layer so that the first electrode (which is arranged on the same layer as the light-shielding metal layer and is connected to the light-shielding metal layer) is electrically connected to the source and drain of the thin film transistor device 301 to improve the efficiency of the storage capacitor. In this embodiment, by providing a storage capacitor on one side of the thin film transistor device, connecting the source to the active layer through a third via hole penetrating the interlayer dielectric layer, and further connecting the source to the light-shielding metal layer through a fourth via hole penetrating the interlayer dielectric layer and the buffer layer so that the first electrode is electrically connected to the source and drain of the thin film transistor device to improve the efficiency of the storage capacitor. Therefore, the current of the OLED display panel can be further maintained stable.

Figures 3, 4:
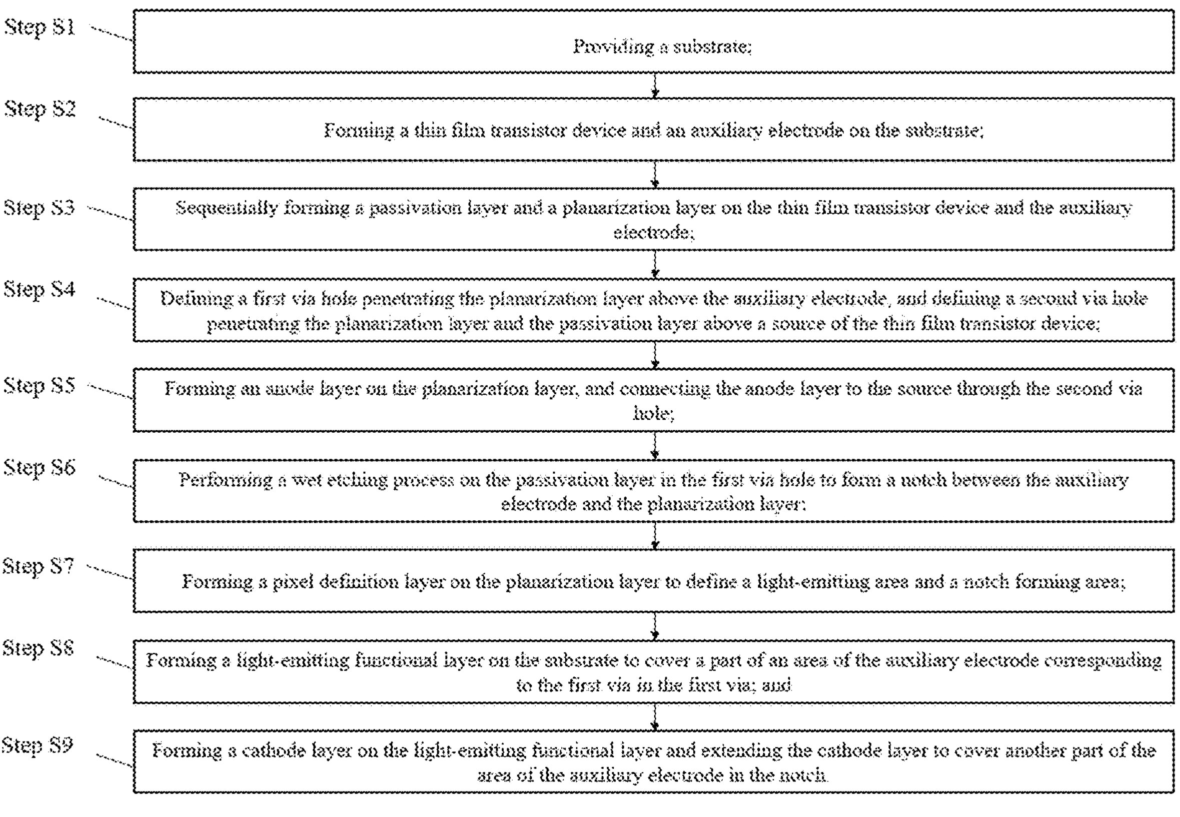
FIG. 3 is a schematic flowchart of a manufacturing method of an OLED display panel according to an embodiment of the present invention.
FIG. 4 is a schematic diagram for the step 9 of the manufacturing method of the OLED display panel in FIG. 3.

As shown in FIG. 3, the process of the manufacturing method of the OLED display panel provided by the embodiment of the present invention includes:

Step S1, providing a substrate;

Step S2, forming a thin film transistor device and an auxiliary electrode on the substrate;

Step S3, sequentially forming a passivation layer and a planarization layer on the thin film transistor device and the auxiliary electrode;

Step S4, defining a first via hole penetrating the planarization layer above the auxiliary electrode, and defining a second via hole penetrating the planarization layer and the passivation layer above a source of the thin film transistor device;

Step S5, forming an anode layer on the planarization layer, and connecting the anode layer to the source through the second via hole;

Step S6, performing a wet etching process on the passivation layer in the first via hole to form a notch between the auxiliary electrode and the planarization layer;

Step S7, forming a pixel definition layer on the planarization layer to define a light-emitting area and a notch forming area (please refer to FIG. 1);

Step S8, forming a light-emitting functional layer on the substrate and covering a part of an area of the auxiliary electrode corresponding to the first via in the first via; and Step S9, forming a cathode layer on the light-emitting functional layer and extending the cathode layer to cover another part of the area of the auxiliary electrode in the notch.

Specifically, in step S6, hydrofluoric acid (HF) may be used to etch the passivation layer in the first via to form a notch between the auxiliary electrode and the planarization layer. During the etching process, except for the notch forming area, other areas are protected by photoresists and will not be affected by the etching solution.

Specifically, in step S7, a pixel definition layer is formed on the planarization layer to define a light-emitting area and a notch forming area. The photoresist in the notch formation area under the planarization layer can be removed by exposure and development processes.

Specifically, in step S8, the light-emitting functional layer is formed by evaporation. By controlling the vapor deposition angle of the vapor deposition source, the light-emitting functional layer in the first via hole only covers a part of the area of the auxiliary electrode corresponding to the first via hole.

Please refer to FIG. 4. FIG. 4 is a schematic diagram for step 9 of the manufacturing method of the OLED display panel in FIG. 3. As shown in FIG. 4 (please refer to FIG. 2 together). In step S9, the cathode layer of the OLED display panel 10' is formed by evaporation, and the evaporation angle of the evaporation source S is controlled to allow the cathode layer to extend to cover part of the area PA of the auxiliary electrode 401 in the notch U.

Figure 5:
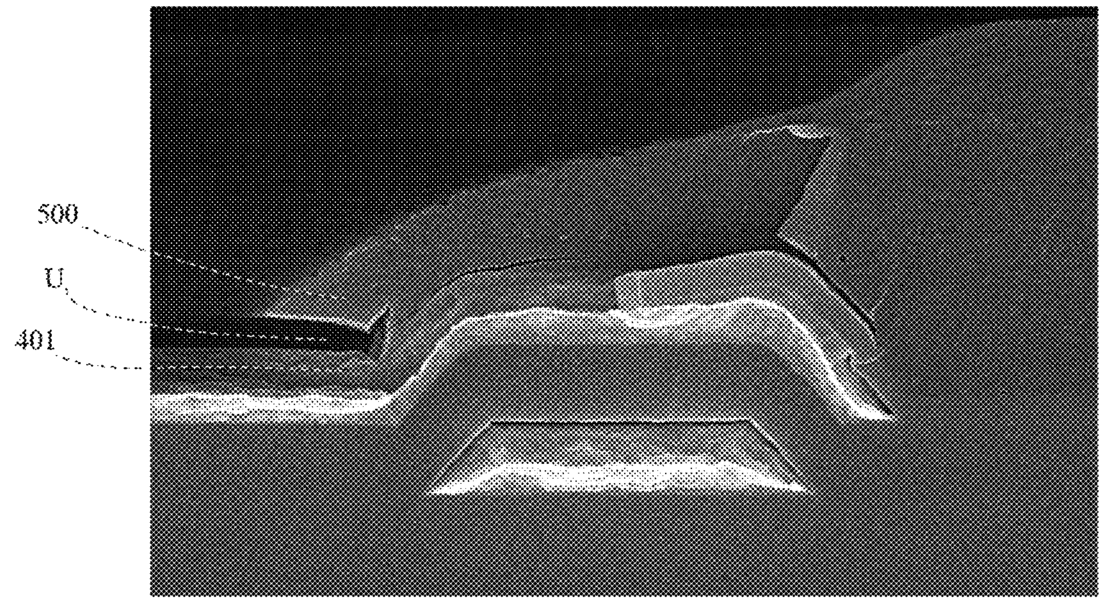
FIG. 5 is an SEM photograph of a cross-sectional structure of the OLED display panel according to the first embodiment of the present invention.

Finally, please refer to FIG. 5. FIG. 5 is a scanning electron microscope (SEM) photograph of a cross-sectional structure of the OLED display panel according to the first embodiment of the present invention. As shown in FIG. 5, in the first and second embodiments of the present invention, a notch U is formed between the planarization layer 500 and the passivation layer 400 above the auxiliary electrode 401. That is, the planarization layer 500 is directly used as the support structure of the notch U so that the cathode layer 703 and the auxiliary electrode 401 can be connected in the notch U, thereby improving the IR Drop problem of the OLED display panel. It has been verified by experiments that the planarization layer 500 will not collapse.

As described above, in the present invention, a notch is defined between the planarization layer and the passivation layer above the auxiliary electrode. That is, the planarization layer is directly used as the support structure of the notch so that the cathode layer and the auxiliary electrode can be connected in the notch, thereby improving the IR Drop problem of the OLED display panel. It has been verified by experiments that the planarization layer will not collapse. Furthermore, the present invention adopts a three-layer molybdenum-titanium/copper/molybdenum-titanium alloy structure for the auxiliary electrode and the signal input pad on the same layer as the auxiliary electrode so that the signal input pad can be directly connected to the control unit without the need of providing a solder pad on the signal input pad for protecting the signal input pad. This can save a photomask in the manufacturing process. In addition, in the present invention, a storage capacitor is provided on one side of the thin film transistor device, and the source is connected to the active layer through a third via hole penetrating the interlayer dielectric layer, and the source is further connected to the light-shielding metal layer through a fourth via hole penetrating the interlayer dielectric layer and the buffer layer so that the first electrode is electrically connected to the source and drain of the thin film transistor device to improve the efficiency of the storage capacitor. Therefore, the current of the OLED display panel can be further maintained stable.

The aforesaid content is just preferred embodiments of the present invention. For those of ordinary skill in the art, without departing from the principle of the present invention, several improvements and modifications can be made. These improvements and modifications should also be regarded as the protection scope of the present invention.

What is claimed is:

1. An organic light-emitting diode display panel, comprising:

a substrate;

a thin film transistor device disposed on the substrate, wherein the thin film transistor device comprises an active layer, a gate layer, a source, and a drain;

a buffer layer disposed between the substrate and the thin film transistor device;

an interlayer dielectric layer disposed on the buffer layer;

a signal input pad disposed on the interlayer dielectric layer;

an auxiliary electrode arranged in a same layer as the source and the drain;

a passivation layer disposed on the source, the drain, and the auxiliary electrode, wherein an opening is defined on the passivation layer above the signal input pad to expose the signal input pad;

a planarization layer disposed on the passivation layer; and a light-emitting device layer disposed on the planarization layer, wherein the light-emitting device layer comprises an anode layer, a light-emitting functional layer, and a cathode layer;

wherein a first via hole penetrating the planarization layer and the passivation layer is defined above the auxiliary electrode, and a notch between the auxiliary electrode and the planarization layer is defined at a bottom of an inner sidewall of the first via hole; and wherein the cathode layer extends through the first via hole to the notch to connect with the auxiliary electrode.

2. The organic light-emitting diode display panel of claim 1, further comprising:

a gate insulating layer disposed between the gate layer and the active layer; and a light-shielding metal layer disposed on the substrate corresponding to the active layer.

3. The organic light-emitting diode display panel of claim 2, wherein the anode layer is connected to the source through a second via hole penetrating the planarization layer and the passivation layer, the source is connected to the active layer through a third via hole penetrating the interlayer dielectric layer, and the source is further connected to the light-shielding metal layer through a fourth via hole penetrating the interlayer dielectric layer and the buffer layer.

4. The organic light-emitting diode display panel of claim 3, further comprising:

a first electrode arranged adjacent to the light-shielding metal layer and electrically connected to the light-shielding metal layer; and a second electrode arranged adjacent to the active layer and corresponding to the first electrode, wherein the second electrode and the first electrode form a storage capacitor.

5. The organic light-emitting diode display panel of claim 4, wherein the first electrode and the second electrode comprise indium gallium zinc oxide.

6. The organic light-emitting diode display panel of claim 1, wherein a thickness of the planarization layer ranges from 1 micrometer to 4 micrometers.

7. The organic light-emitting diode display panel of claim 1, wherein the auxiliary electrode and the signal input pad comprise a molybdenum titanium/copper/molybdenum titanium alloy.

8. An organic light-emitting diode display panel, comprising:

a substrate;

a thin film transistor device disposed on the substrate, wherein the thin film transistor device comprises an active layer, a gate layer, a source, and a drain;

a buffer layer disposed between the substrate and the thin film transistor device;

an interlayer dielectric layer disposed on the buffer layer;

a signal input pad disposed on the interlayer dielectric layer;

an auxiliary electrode arranged in a same layer as the source and the drain;

a passivation layer disposed on the source, the drain, and the auxiliary electrode, wherein an opening is defined on the passivation layer above the signal input pad to expose the signal input pad;

a planarization layer disposed on the passivation layer, wherein a thickness of the planarization layer ranges from 1 micrometer to 4 micrometers; and a light-emitting device layer disposed on the planarization layer, wherein the light-emitting device layer comprises an anode layer, a light-emitting functional layer, and a cathode layer;

wherein a first via hole penetrating the planarization layer and the passivation layer is defined above the auxiliary electrode, and a notch between the auxiliary electrode and the planarization layer is defined at a bottom of an inner sidewall of the first via hole;

wherein the cathode layer extends through the first via hole to the notch to connect with the auxiliary electrode; and wherein the light-emitting functional layer covers a partial area of the auxiliary electrode corresponding to the first via hole, and the cathode layer covers another partial area of the auxiliary electrode in the notch.

9. The organic light-emitting diode display panel of claim 8, further comprising:

a gate insulating layer disposed between the gate layer and the active layer; and a light-shielding metal layer disposed on the substrate corresponding to the active layer.

10. The organic light-emitting diode display panel of claim 9, wherein the anode layer is connected to the source through a second via hole penetrating the planarization layer and the passivation layer, the source is connected to the active layer through a third via hole penetrating the interlayer dielectric layer, and the source is further connected to the light-shielding metal layer through a fourth via hole penetrating the interlayer dielectric layer and the buffer layer.

11. The organic light-emitting diode display panel of claim 10, further comprising:

a first electrode arranged adjacent to the light-shielding metal layer and electrically connected to the light-shielding metal layer; and a second electrode arranged adjacent to the active layer and corresponding to the first electrode, wherein the second electrode and the first electrode form a storage capacitor.

12. The organic light-emitting diode display panel of claim 11, wherein the first electrode and the second electrode comprise indium gallium zinc oxide.

13. The organic light-emitting diode display panel of claim 8, wherein the auxiliary electrode and the signal input pad comprises a molybdenum titanium/copper/molybdenum titanium alloy.

14. A manufacturing method of an organic light-emitting diode display panel, comprising:

providing a substrate;

forming a thin film transistor device and an auxiliary electrode on the substrate;

sequentially forming a passivation layer and a planarization layer on the thin film transistor device and the auxiliary electrode;

defining a first via hole penetrating the planarization layer above the auxiliary electrode, and defining a second via hole penetrating the planarization layer and the passivation layer above a source of the thin film transistor device;

forming an anode layer on the planarization layer, and connecting the anode layer to the source through the second via hole;

performing a wet etching process on the passivation layer in the first via hole to form a notch between the auxiliary electrode and the planarization layer;

forming a pixel definition layer on the planarization layer to define a light-emitting area and a notch forming area;

forming a light-emitting functional layer on the substrate to cover a part of an area of the auxiliary electrode corresponding to the first via hole in the first via hole; and forming a cathode layer on the light-emitting functional layer and extending the cathode layer to cover another part of the area of the auxiliary electrode in the notch;

wherein the step of forming the cathode layer on the light-emitting functional layer and extending the cathode layer to cover another part of the area of the auxiliary electrode in the notch is implemented by changing an evaporation angle of an evaporation source.

* * * * *